United States Patent [19]

Val

[11] Patent Number: 5,526,230
[45] Date of Patent: Jun. 11, 1996

[54] 3D INTERCONNECTION PROCESS FOR ELECTRONIC COMPONENT PACKAGES AND RESULTING 3D COMPONENTS

[75] Inventor: Christian Val, Paris, France

[73] Assignee: Thomson-CSF, Puteaux, France

[21] Appl. No.: 124,805

[22] Filed: Sep. 21, 1993

[30] Foreign Application Priority Data

Oct. 13, 1992 [FR] France .................. 92 12209

[51] Int. Cl.[6] ............................................. H05K 7/20
[52] U.S. Cl. .................... 361/704; 165/80.3; 165/185; 174/16.3; 257/713; 257/686; 257/723; 257/796; 361/721; 361/733; 361/735; 361/744; 361/809; 361/810; 361/820; 361/829
[58] Field of Search ............................ 165/80.2, 80.3, 165/185; 174/16.3; 257/686, 723–725, 706, 712, 713, 777, 675, 796; 361/704, 689, 709–710, 715–728, 723, 733, 724–725, 735, 744, 790, 807–810, 813, 820, 829; 437/208, 915; 29/830, 525; 439/66

[56] References Cited

U.S. PATENT DOCUMENTS

| | | | |
|---|---|---|---|
| 3,029,495 | 4/1962 | Doctor | 29/830 |
| 3,370,203 | 2/1968 | Kravitz et al. | 437/915 |
| 4,862,249 | 8/1989 | Carlson | 257/686 |
| 4,868,712 | 9/1989 | Woodman | |
| 5,007,842 | 4/1991 | Deak et al. | 439/66 |

FOREIGN PATENT DOCUMENTS

| | | |
|---|---|---|
| 0354708 | 8/1989 | European Pat. Off. . |
| 0478188 | 9/1991 | European Pat. Off. . |
| 8808203 | 10/1988 | WIPO . |
| 9203035 | 2/1992 | WIPO . |

OTHER PUBLICATIONS

List of Applicants U.S. application and patents 1 page.

*Primary Examiner*—Gregory D. Thompson
*Attorney, Agent, or Firm*—Roland Plottel

[57] ABSTRACT

A device and method for interconnection packages in a stack. Each package encapsulates, for example a semiconductor chip containing an integrated circuit, which for example may be a memory. The packages (2) which have connecting pins (21) are mounted on support grid (4) which preferably act as a heat shunt, and are stacked and linked to each other with a resin coating (5). A stack (3) is cut out so that the pins on the packages and one edge of the grids are flush with faces (31, 32) of the stack (3). Connections between the packages themselves, and between the packages and stack connecting pads, are made on the faces of the stack. The connecting pads are where necessary fitted with connecting pins.

11 Claims, 8 Drawing Sheets

CROSS SECTION A-A

CROSS SECTION BB

3D INTERCONNECTION PROCESS FOR ELECTRONIC COMPONENT PACKAGES AND RESULTING 3D COMPONENTS

BACKGROUND OF THE INVENTION

This invention relates to a process for interconnecting stacked packages, each package encapsulating an electronic component which may be passive or active, discrete or integrated, a semiconductor chip containing for example an integrated circuit, or one or several sensors. These components will henceforth be referred to indiscriminately as components or chips. The invention also relates to a resulting so-called three dimensional, or 3D, component.

The design of current electronic systems, both civilian and military, must take into account increasingly stringent requirements in terms of compactness, owing to the increasing number of circuits implemented. To this end, the stacking of integrated circuits has already been proposed, as described for instance in the U.S. Pat. No. 4,706,166. According to this method, the chips themselves are arranged on a printed circuit, mounted in contact with each other perpendicularly to the printed circuit; the connecting pads of each chip are all located on one side of the chip; this is the side resting on the printed circuit to which the connections are made. However, this arrangement presents limitations associated with the number of pads which it is physically possible to fit on one side of a semiconductor chip. Further, it is a costly solution owing to the fact that the chips are not standard (the pad layout must be changed). Also, the connections made are difficult to access and are not visible, which is a requirement in some cases, this, consequently limits the use of the chips.

An object of the invention is to avoid the said limitations by stacking and then interconnecting, not the chips, but rather packages containing the components, the packages mounting on grids, and by using the stacking faces as the interconnecting faces.

In this way, the drawbacks and the limitations mentioned above are avoided and the costs are reduced: in fact, and notably in the case of semiconductor chips, chips housed in a (usually plastic) package are available on the market at lower prices than those commonly charged for the chips alone, mainly for reasons of quantities manufactured, and, in addition, testing of the packaged chips is more convenient and therefore less costly. Moreover, mounting each of the packages on a grid facilitates the formation of the pile and provides a heat shunt.

More specifically, according to the invention, packages containing components and fitted with pins, are each mounted on a heat (and preferably electrical) conducting grid. The packages, together with their grids, are stacked; the packages are then tied together by means of an insulating material such as for example, a polymer resin. The resulting stack is then cut out so that the pins of the packages and preferably at least one side of the grids are flush with the sides of the stack, and then electric connections are made between the pins on the sides of the stack.

The invention will be better understood and other characteristics and features will be made clear with the aid of the following description, provided as an example, together with the appended drawings:

FIGS. 3a to 3d, showing variants of one step in the manufacture of the device according to the invention, FIG. 3b, being a cross section through part of FIG. 3a;

FIGS. 9a and 9b, showing manufacturing details of the previous Figure, FIG. 9b, being a cross section through part of FIG. 9a;

FIG. 10, another embodiment of the device according to the invention. In these Figures, the same references always refer to the same elements. For reasons of clarity, the real scale has not been respected.

Figure 1:
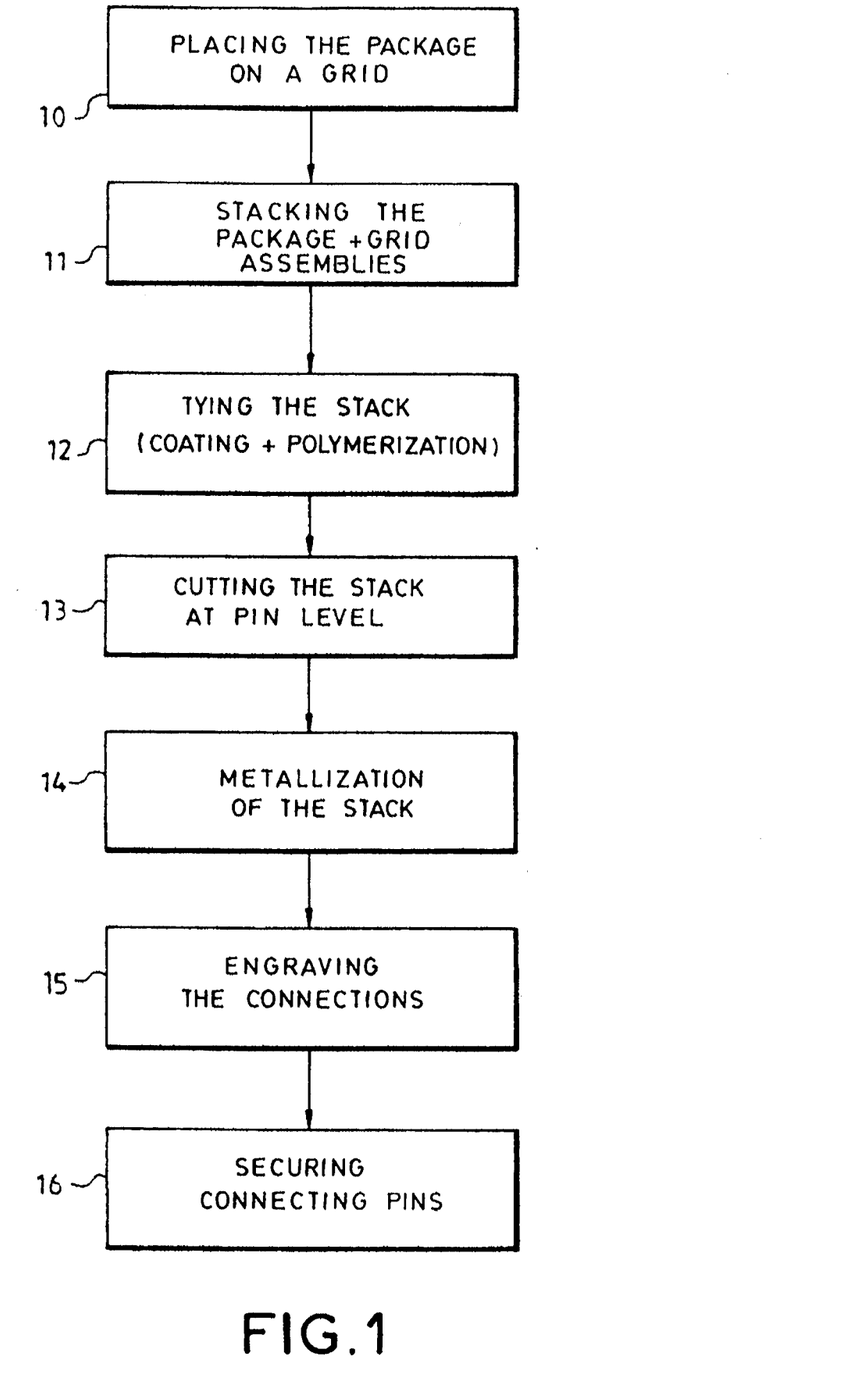
FIG. 1, showing an embodiment of the process according to the invention.

As stated, FIG. 1 illustrates an embodiment of the process according to the invention.

The first step of the process, marked 10, consists in placing a package on a supporting grid, the functions of which will be explained below. The package contains an electronic component, for example a semiconductor chip accommodating an integrated circuit; it is also fitted with connecting pins.

Figure 2:
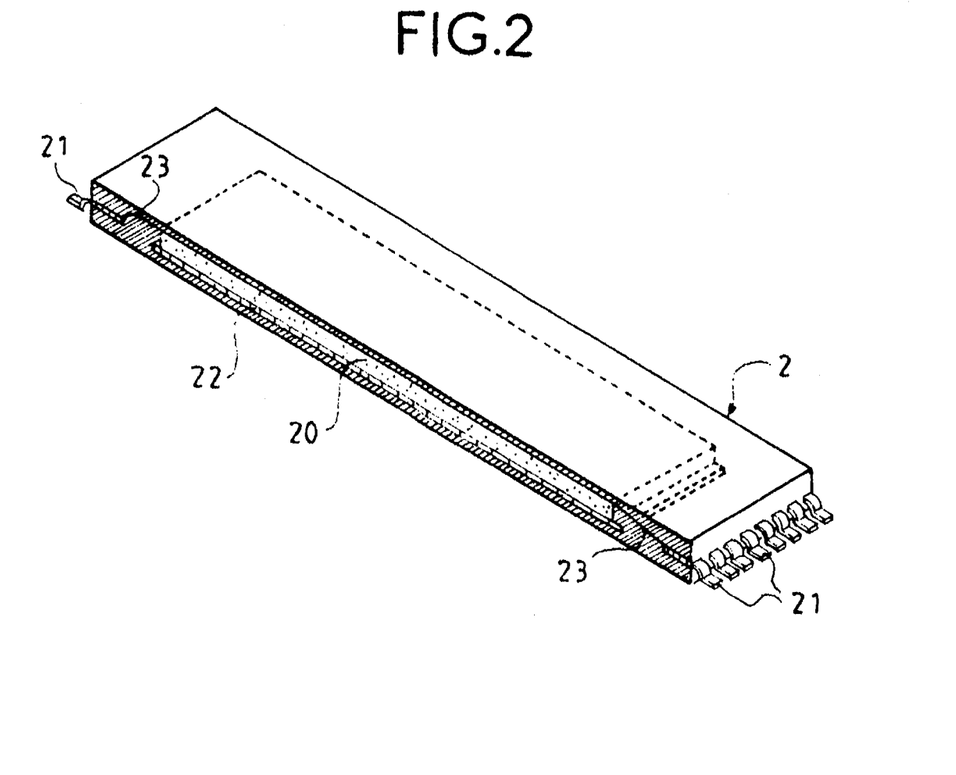
FIG. 2, showing an example of a package suitable to be inserted in the device according to the invention.

FIG. 2 shows an example of such a package.

This Figure presents a package, marked 2, rectangular in this example it includes connecting pins 21 emerging for example on two sides, in this example on the short sides. A lengthways cross-section has been made in the package; this reveals the chip 20, generally resting on an electric conducting sheet 22, as well as two pins 21 extending inside package 2 and linked by conducting wires 23 to the connecting pads (not shown) of chip 20.

In this step, the packages are each mounted on a grid as illustrated in FIGS. 3a to 3d.

Figure 3A:
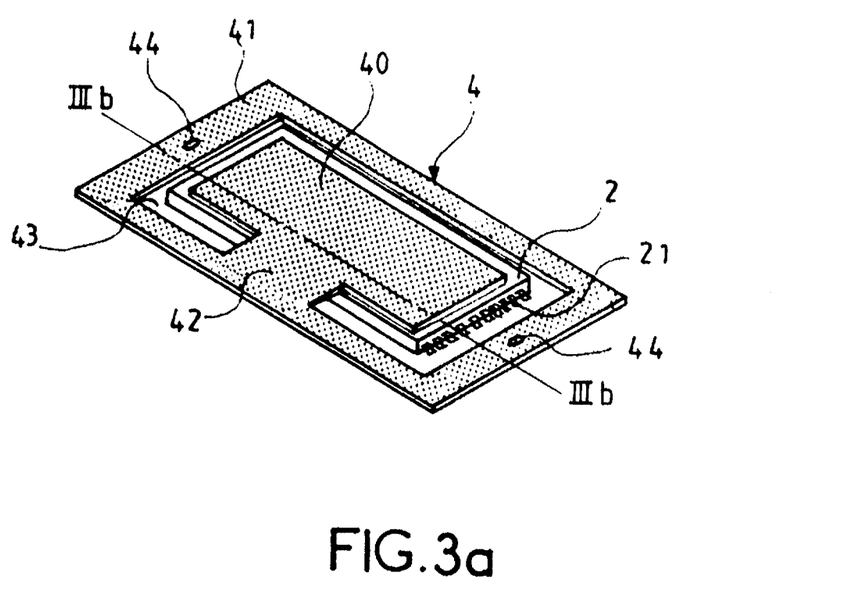

FIG. 3a shows package 2 equipped with its pins 21.

A sheet 4, called a grid, in this example roughly rectangular in shape, is attached to one of the faces of the package, in this example the upper face. Sheet 4 includes a central part 40, a frame 41 surrounding the central part but separated from it by a cut-out 43, the central part only being attached to the frame by at least one tongue 42 in this Figure the width of which can reach approximately the length of package 2. In this example, the central part has a surface area close to that of package 2, but slightly smaller; however the sides of the central part which are not on the side of pins 21 may extend beyond package 2. Frame 41 also preferably features one or several locating holes 44. Grid 4 is attached to package 2 using, for example, a thin layer of glue, the thickness of which is preferably even. For the sake of the clarity of the diagram, the surface of grid 4 is shown as a dotted area. Grid 4 is preferably made from a good heat conducting material.

Figure 3B:
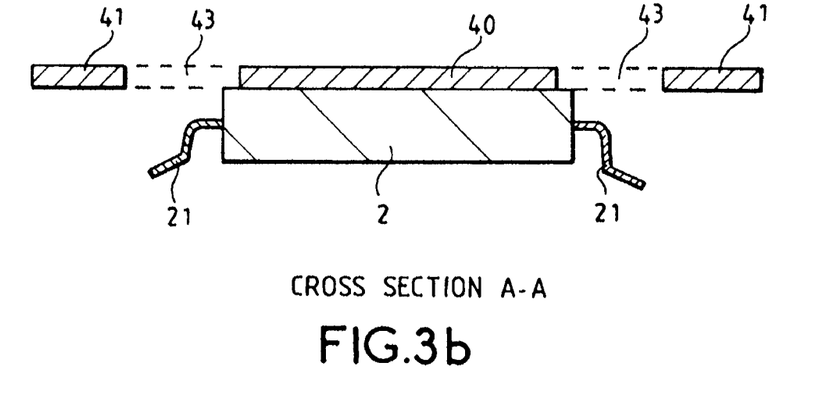

FIG. 3b is a cross section along axis IIIa—IIIa of FIG. 3a, showing package 2 fitted in this example on its upper face with central part 40, separated from frame 41 by cut-out 43.

Figure 3C:
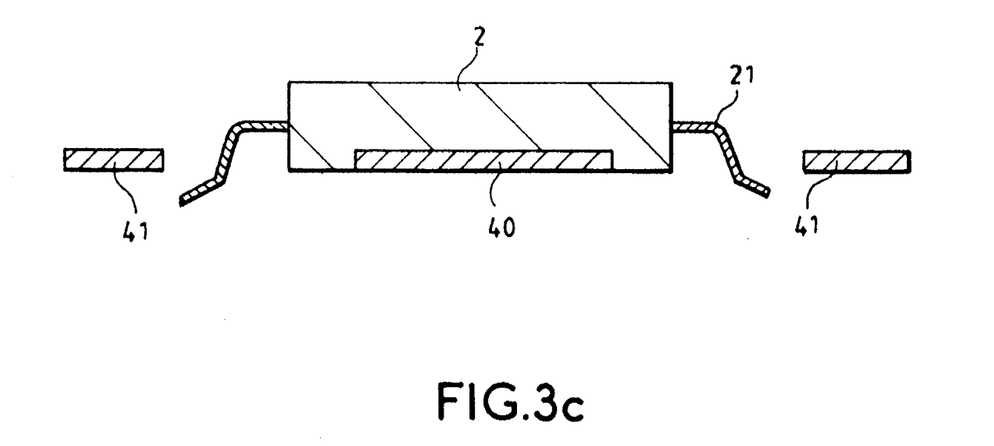

FIG. 3c shows, also in cross section, a variant of FIG. 3b, in which central part 40 of the grid is placed in a recess provided for this purpose in package 2, in this example in its lower face.

Figure 3D:
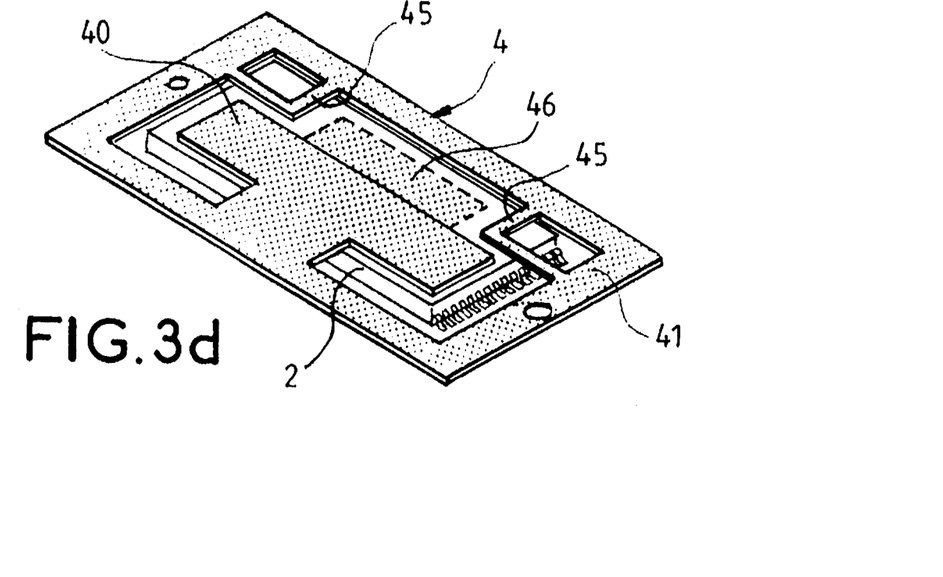

FIG. 3d represents a variant of grid 4, in which the grid also includes one or several strips 45, called return connections, two of these being shown in the Figure.

These connections 45 connect two sides of frame 41 for example in an L shape, so as to pass over (or under) the package. In this variant, the material of which the grid is made must be an electric conductor.

The surface area of central part 40 is slightly reduced in this case, as for example illustrated in the Figure, with a variant 46 shown as a dotted area. Naturally, other shapes may be adopted for the central part or the return connections, provided that any contact between central part and return connections is avoided.

Figure 4:
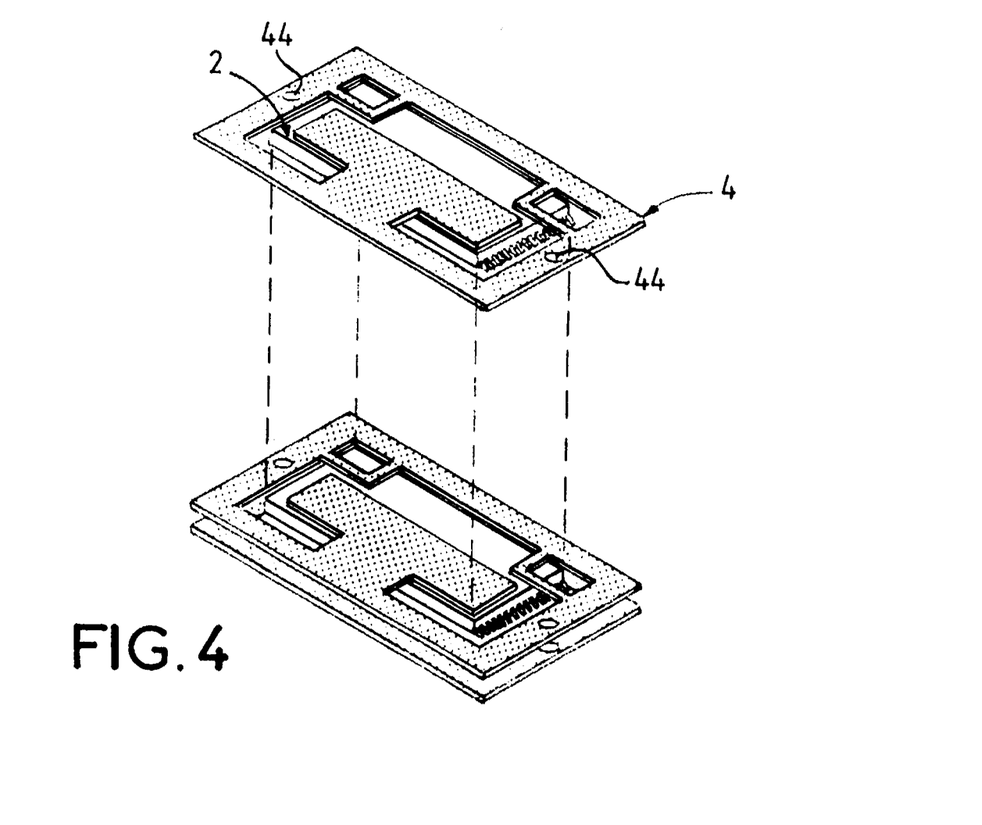
FIG. 4 showing a subsequent step in the manufacture of the device according to the invention.

The following step marked 11 on FIG. 1 and illustrated on FIG. 4, consists in stacking packages 2 fitted with their grid 4, one on top of the other without it being necessary to reserve space between the packages, preferably by using locating holes 44. As an example, the grids used are of the type described in FIG. 3d.

Figure 5:
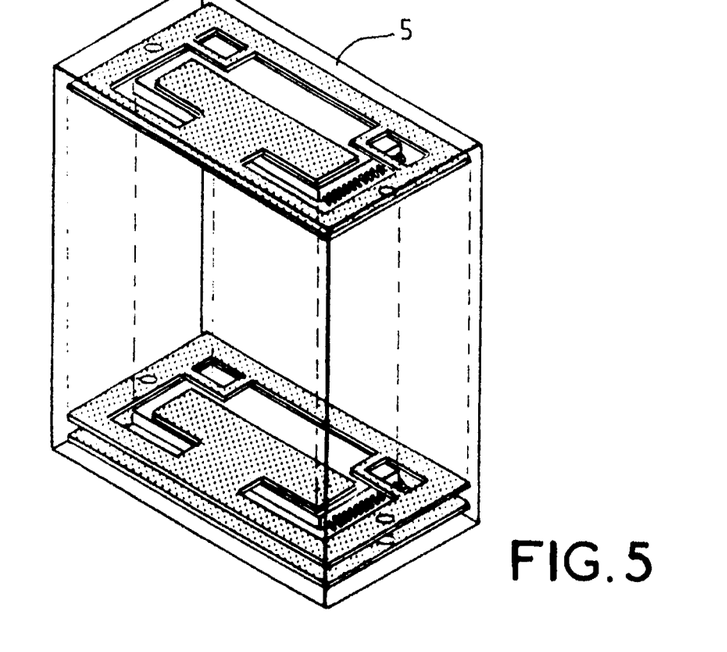
FIG. 5 showing a subsequent step in the manufacture of the device according to the invention.

The following step marked 12 in FIG. 1 and illustrated in FIG. 5, consists in tying the stack by coating the assembly with an electrical insulating material 5, such as a polymerizable resin which may be an epoxy for example. For the sake of the clarity of the diagram, packages 2 and grids 4 have not been shown in dotted lines, although they are not visible in FIG. 5.

The following step (13, FIG. 1) consists in cutting out the stack at the cut-out 43 of the grid, between central part 40 and frame 41, so as to remove the frame and, in a preferred embodiment, to make the central part 40 touch at least one of the faces of the stack, to allow the grid to act as a heat shunt, and to cut off pins 21 of the different packages so they are flush with the stack faces.

Figure 6:
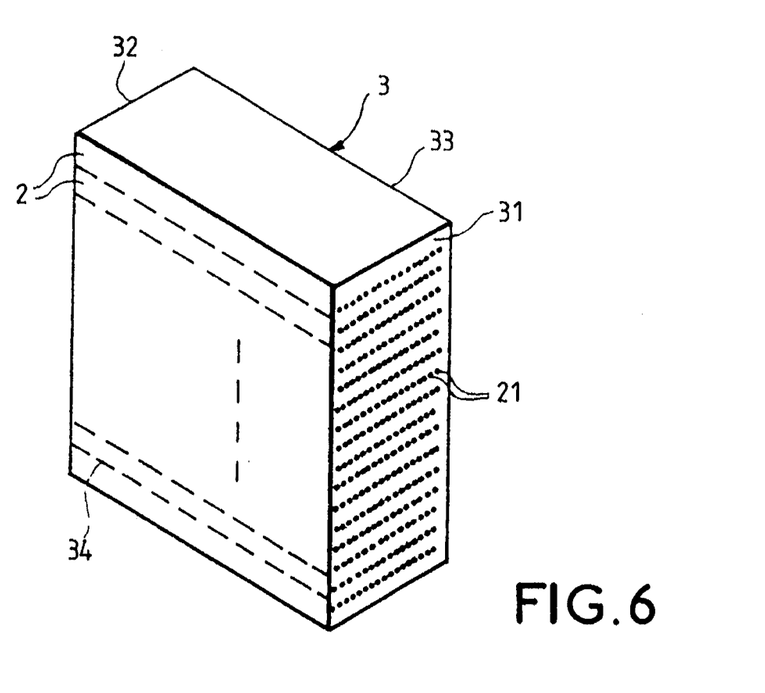
FIG. 6, showing a subsequent step in the manufacture of the device according to the invention.

FIG. 6 shows the result of step 13.

This figure shows side faces 31 and 32 with which pins 21 are flush, the upper face 33 (parallel to packages 2) and one of the lateral faces 34, of the stack, now marked 3. Packages 2 are represented in dotted lines.

Figure 7:
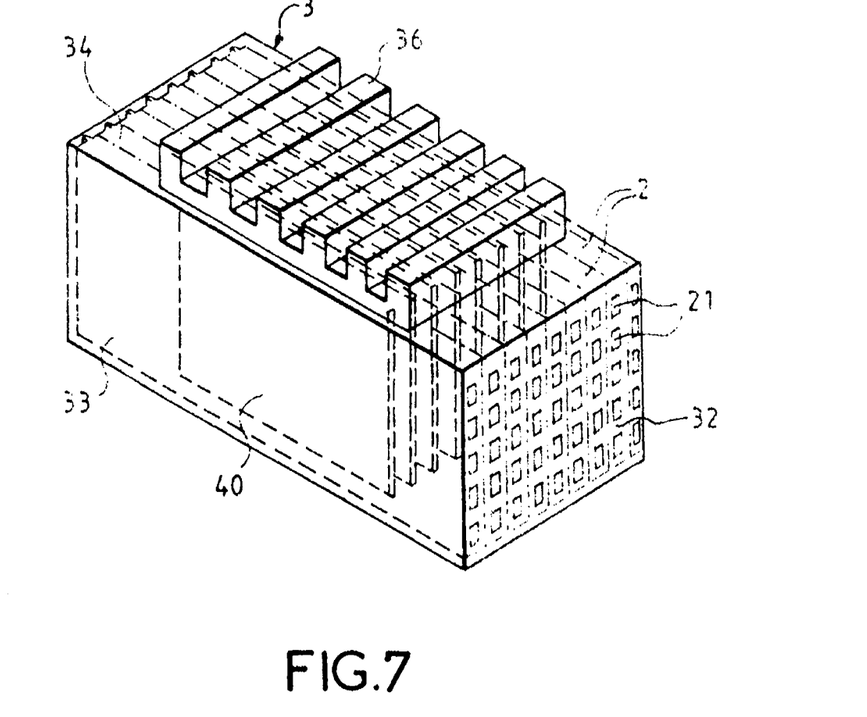
FIG. 7 showing variant of the previous Figure.

FIG. 7 is a variant of the previous Figure, featuring in addition a heatsink 36, such as a finned radiator, on the lateral face 34 of stack 3, with the central parts 40 flush to act as heat shunts. A heatsink of the same type may also be arranged on the stack face opposite face 34 and where shunts 40 may also be flush.

The radiator 36 may for example be glued, with an epoxy glue for instance, either directly to the stack face or following metallization of the said face as described below.

The following step (14, FIG. 1) is in depositing one or several conducting layers, which may for instance be metallic, on the faces of the previously obtained stack 3.

The following step (15, FIG. 1) is in producing connections between pins 21 on the faces of stack 3, using the metallic layer.

Figure 8:
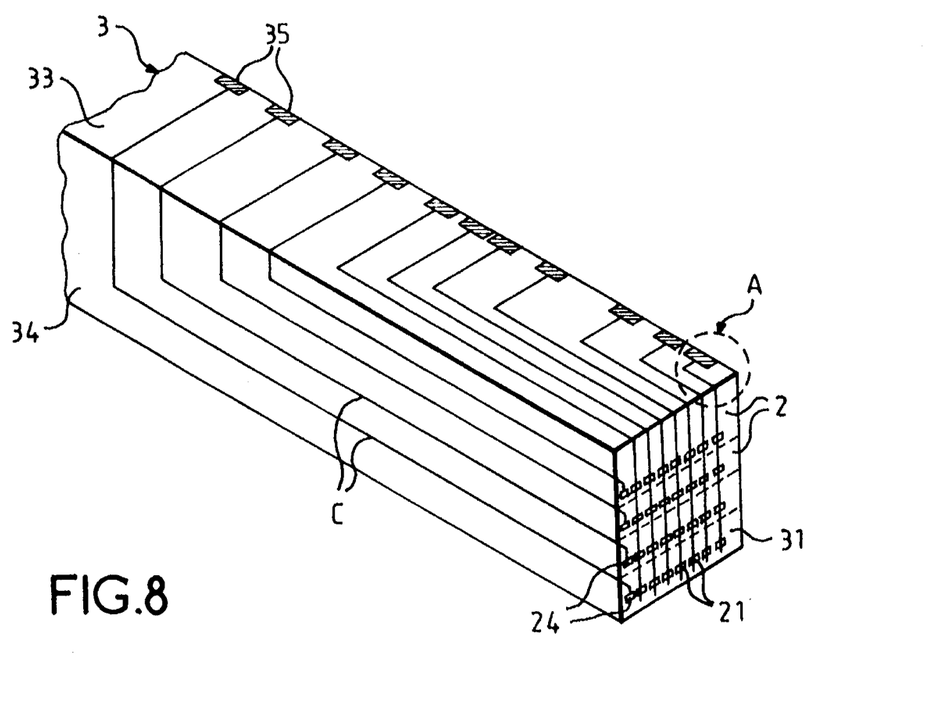
FIG. 8 showing a partial view of an embodiment of the device according to the invention.

FIG. 8 is a partial view of a stack according to the invention, illustrating examples of connection.

This Figure shows stack 3 with faces 31, 33 and 34 visible. Packages 2 are also shown in dotted lines together with their connecting pins 21, flush with face 31. Stack 3 includes on one or several of its faces, for instance on face 33, pads 35, called stack pads, provided for electric connection to external circuits. Pins 21 are both interconnected and, where necessary, linked to stack pads 35 via connections C.

As an example, the Figure represents the case where packages 2 contain memories. In this case, for each of the packages, the corresponding pins are connected to each other and to a corresponding stack pad 35, except for one pin in each package, marked 24. This pin 24, which corresponds to the memory selection input, is linked individually for each package to a distinct stack pad 35. Of course, if the packages feature more pins such as 24, requiring customization, the same procedure is followed for each.

However, in certain cases, the pins to be customized, such as 24, can lead to routing difficulties, particularly if there are too many of them.

Return connections 45 (FIG. 3d) which can be included in grid 4 provide a solution to this problem.

Namely, such a connection 45 may be featured in the vicinity of a pin to be customized. When cutting the stack, it the connection 45 is also cut and made flush with the stack faces. It is then connected to the pin to be customized by connection C. It shall be remembered that the return connection 45 connects two distinct surfaces of the stack: it thus allows the connection of the pin to be customized to be routed to another face of the stack, preferably without any pins 21.

Figure 9A:
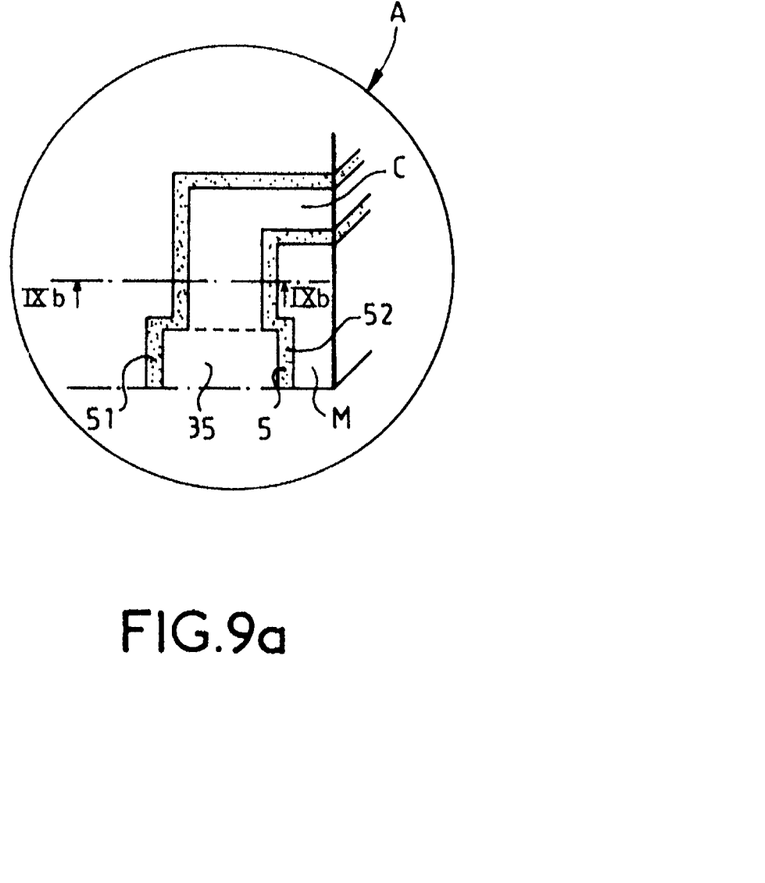
Figure 9B:
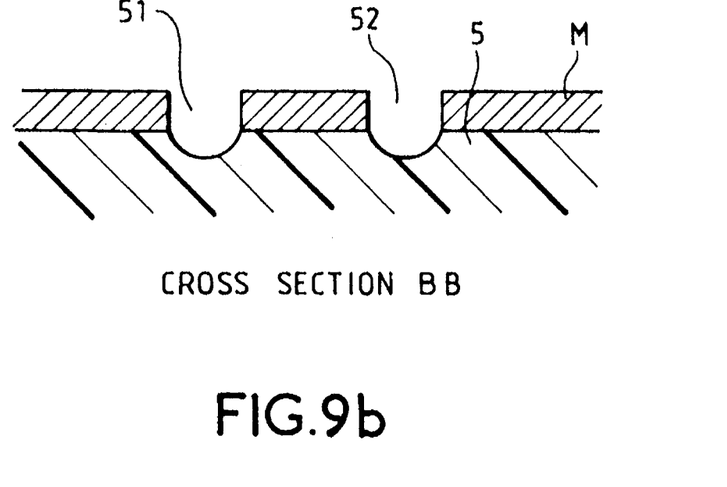

FIGS. 9a and 9b present an embodiment of connections C in greater detail.

FIG. 9a is a partial and enlarged view of a piece A of the stack in FIG. 8, showing connection C and stack pad 35. FIG. 9b is a cross section along axis IXb of FIG. 9a.

Each of the connections C is formed by two engravings 51 and 52, produced by a laser beam which locally destroys the conducting layer, marked M, and reveals the stack tying insulating layer 5; this material 5 has been shown in dotted lines on FIG. 9a for the sake of the clarity of the diagram. In this way, connection C is electrically isolated from the rest of layer M. It is of advantage to effect make the stack pads 35 using the same laser engraving technique as represented on FIG. 9a.

Another method for producing connections C is in firstly making grooves in the coating material of stack 3, where pins 21 come flush, in order to free the ends of said pins, and routing the grooves as per the layout retained for connections C. The method then consists in depositing an electrical conducting layer (metal for example) on the whole stack, faces and grooves; finally, the conducting layer is removed from the flat surfaces of the stack (by polishing or by laser, for example), so that the layer only remains in the grooves where it makes the desired connections.

Note that connections C and stack pads 35 may be arranged on any or all of the stack faces, depending on the application in question.

Figure 10:
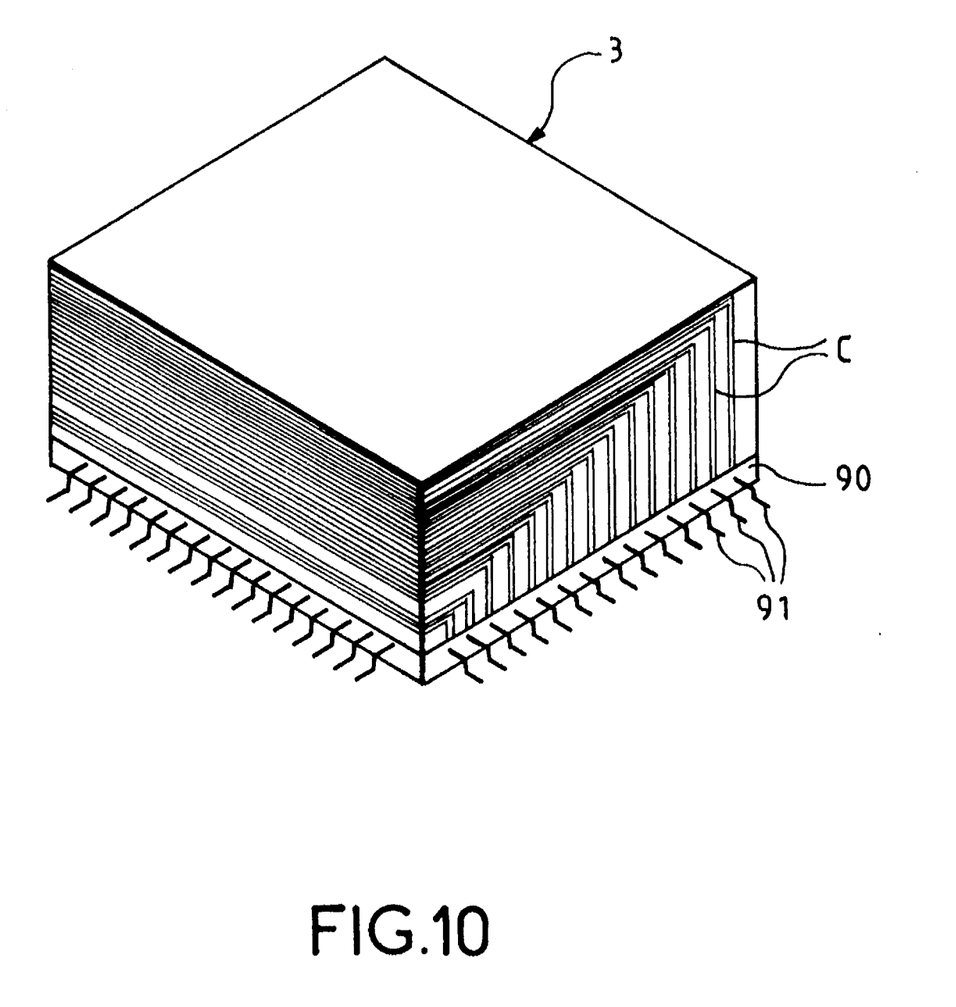

The last step of the process represented in FIG. 1, marked 16, consists when needed in securing connecting pins to the stack, as illustrated in FIG. 10.

This Figure shows stack 3 and, as an example, connections C linking pins 21 (not shown) to the stack pads; however these are not visible here because all are arranged in this example on the lower face of the stack. The stack pads are covered by an electrical insulating ring 90 bearing connecting pins 91. Ring 90, manufactured by moulding for instance, has approximately the same external dimensions as stack 3 and is bonded to it. Pins 91 cross through the ring to come flush with its upper face, opposite the stack pads. A solder, a lead-tin solder for example, is positioned on pins 91 or on the stack pads before bonding the ring. After bonding, the solder is remelted, for instance using a laser beam through the ring, to provide pad-pin electric connection.

This last step is optional. In fact, stack 3 is not necessarily fitted with connecting pins; it may be directly soldered with the stack pads, onto a printed circuit or onto another stack. It may alternatively be fitted conventionally with connecting pins designed to pass through the metallized holes of a printed circuit board.

The above describes a device for the 3D interconnecting of packages housing electronic components, presenting numerous advantages:

- it permits a high density of components: the packages are stacked, and this is achieved without much spacing between the packages;
- it can be used with packages featuring connecting pins on any number of faces: the invention does not require one or two of the lateral faces to be free of pins;
- it is applicable to the stacking of any number of packages;
- it offers a low production cost, notably because it is suited to the use of packages issuing from the mould, when they are still linked in strips: the strips are then stacked as described above for the packages and several stacks can thereby be produced collectively. In addition, securing a grid to the packages before stacking provides a convenient support for making and centering the stack, allows a heat shunt to be incorporated in the stack, and finally gives additional freedom in routing the connections on the stack faces, thanks to the return connections which can be made on the grid.

I claim:

1. Device comprising packages (2) each package encapsulating at least one electronic component (20) an having connecting pins (21), said packages being each linked to a grid 40, and being layered one on top of the other, said device further including an insulating material (5) which embeds, coats and ties the layered packages into a stack having faces (31, 32, 33, 34), said pins (21) being made flush with at least one of said stack faces (31, 32) and connections (C) between sad pins (21) being carried on said at least one of the sack faces (31, 33, 34).

2. Device comprising packages (2) each package encapsulating at least one electronic component (20) and having connecting pins (21), said packages being each linked to grid 40, and being layered one on top of the other, said device further including an insulating material (5) which embeds, coats and ties the layered packages into a stack having faces (31, 32, 33, 34), said pins (21) being made flush with at least one of said stack faces 31, 32) and connections (C) between said pins (21) being carried on said at least one of the stack faces (31, 33, 34), said grid (4) comprising a central part (40), having at least one tongue (42), connected to a frame (41) which has been removed and said tongue or said central, part, if said tongue has been completely removed, has an edge which is flush with one of the stack faces.

3. Device comprising an intermediate stack having packages (2) and grids (4), each package containing at least one electronic component (20) and having connecting pins (21), each of said packages being linked to a different grid, each of said grids comprises a central part (40) linked to a frame (41) by at least one tongue (42); said packages and grids being arranged one on top of the other, and electrically insulating material (5) coating and tying the stacked packages together.

4. Device as claimed in claim 1 or 2, wherein the grids (4) are of a material which is heat conducting, and the grids are flush with one of the stack faces (34, FIG. 7), thus forming a heat shunt.

5. Device as claimed in claim 1 or 2, wherein said grids (4) are made from an electric conducting material, and further comprises at least one return connection (45), extending between two of the stacks faces, said return connection being linked to a package pin (21) via a connection (C).

6. Device as claimed in claim 1 or 2, wherein said electric connections (C) between the pins (21) on the stack faces comprise a deposited conducting layer (M) on the stack faces, which layer (M) has been engraved in order to form the electric connections (C).

7. Devices as claimed in claim 1 or 2, further comprising stack pads (35) connecting the stack (3) to external circuits, said electric connections (C) between the pins (21) also linking together at least some of said pins (21) and said stack pads (35).

8. Device as claimed in claim 1 or 2, further comprising a plurality of stack connecting pins (91) secured to the stack (3) and with connection to said connections (C).

9. Device as claimed in claim 2 or 3, wherein said frame (41) comprises positioning holes (44) for arranging packages one on top of the other.

10. Device as claimed in claim 2 or 3, wherein said grid (4) further comprises at least one return connection (45), linking together two sides of said frame (41), the grid (4) being made from an electric conducting material.

11. Device of claim 3, wherein said grids (4) are made of a heat conducting material.

* * * * *